United States Patent [19]

Fryer et al.

[11] 4,285,595

[45] Aug. 25, 1981

[54] MODULAR ENCODER

[75] Inventors: Ronald W. Fryer, Santa Barbara; Jess Guerra, Goleta, both of Calif.

[73] Assignee: Electro-Craft Corporation, Hopkins, Minn.

[21] Appl. No.: 61,304

[22] Filed: Jul. 27, 1979

Related U.S. Application Data

[62] Division of Ser. No. 868,887, Jan. 12, 1978, Pat. No. 4,184,071.

[51] Int. Cl.³ .............................................. G01D 5/34
[52] U.S. Cl. ................................... 356/150; 356/243; 356/399
[58] Field of Search ............... 356/138, 150, 243, 399, 356/400, 401; 250/231 SE, 237 G

[56] References Cited

U.S. PATENT DOCUMENTS

| | | | |
|---|---|---|---|
| 3,058,001 | 10/1962 | Dertouzos | 250/231 SE |
| 3,531,650 | 9/1970 | Cronin | 250/237 G |
| 3,900,732 | 8/1975 | Costales | 356/400 |
| 4,075,478 | 2/1978 | Walker | 250/231 SE |

Primary Examiner—R. A. Rosenberger
Attorney, Agent, or Firm—Shroeder, Siegfried, Ryan, Vidas, Steffey & Arrett

[57] ABSTRACT

A modular encoder with a dimensionally stable housing which can be easily aligned for mounting on a motor housing. The encoder utilizes a monolithic, in-line, sensor array and a single light source to achieve improved long-term performance and includes improved alignment means permitting a user to readily align the encoder with a motor. Pre-alignment of the mask and sensor assembly simplifies the alignment performed by the user.

2 Claims, 10 Drawing Figures

MODULAR ENCODER

This is a division of application Ser. No. 868,887, filed Jan. 12, 1978 and U.S. Pat. No. 4,184,071.

A rotary shaft angle incremental encoder is a digital data transducer mounted typically on a motor shaft to provide a pulse for each increment of resolution. The encoder can be operated as a bi-directional encoder by generating two output signals shifted by a predetermined phase angle. Rotary incremental encoders are used to provide a means for either incremental position sensing or pulse rate velocity sensing.

Although opto-electronic means are often utilized for pulse or code generation, both magnetic pickup and brush contact configurations have also played significant roles in the history of encoder development. The increasing demand for higher resolution, higher pulse frequencies, greater accuracy, and lower cost, coupled with the rapid development of solid state electronics dictates the use of optical disc encoding for the foreseeable future.

The mechanism for conversion from mechanical motion to electrical pulses, via opto-electronic methods, entails the shuttering of a light beam passing through a rotating disc and a stationary mask to a photosensitive detector. The rotary disc has alternate opaque and transparent sectors, any pair of which represents an increment. Normally, the alternating sectors are equal in width in order to optimize the optical exposure and to achieve symmetrical output signals. The inclusion of a stationary mask or stator with a transparent slit or slits corresponding to those of the rotor disc is determined by the field of view of the photosensitive device relative to the sector width of the alternating sectors. Stators are generally necessary for high resolution encoders. Such stators commonly utilize multiple slits.

Although they do not constitute a new form of an encoder per se, encoder kits or modular encoders have been manufactured for several years. The popularity of this type of encoder is based upon its suitability for application in several areas where standard encoders, coupled to the motor shaft at the manufacturing facility, cannot be used. One such application is that of a high-performance stepping motor, and the other is that of high-speed tape capstan drive torque motors. In both applications, coupling standard encoders to motor shafts presents a performance, cost, and packaging incompatibility. For example, tape drive motors require a minimum inertia load, high speed operation, minimal frictional loading, and extremely rigid shaft-to-code disc coupling (i.e. no windup under high acceleration and deceleration). These requirements, together with the problem of mounting the encoder between the motor and capstan, dictate use of a shaftless modular encoder or kit.

The kit is so-called because it is a device requiring final assembly of the component parts by the motor user. Since the kit has no shaft and bearings of its own to establish and maintain a stable mechanical relationship between the moving and stationary parts, the viability and accuracy of the kit depends upon the user being able to provide the necessary motor shaft for the rotor and a stationary mounting means for mounting the encoder in working relationship with the motor shaft. The ability of the user to integrate the modular encoder or kit into his mechanical system with a minimum of adjustment and calibration effort is the major consideration having an impact on the characteristics of the kits.

The present invention provides an improved encoder kit which provides long-term stable output signals and is particularly adapted to be installed by the user with a minimum of alignment and calibration effort.

Accordingly, it is an object of this invention to provide an improved modular encoder.

It is a further object of this invention to provide a modular encoder which can be readily aligned by a user.

It is a still further object of this invention to provide a means for pre-calibrating a modular encoder at the time of its manufacture to simplify the calibration steps necessary to be performed by the user.

These and other objects and advantages of the invention more fully appear from the following description made in connection with the accompanying drawings, wherein like reference characters refer to the same or similar parts throughout the several views and in which.

Figure 1:
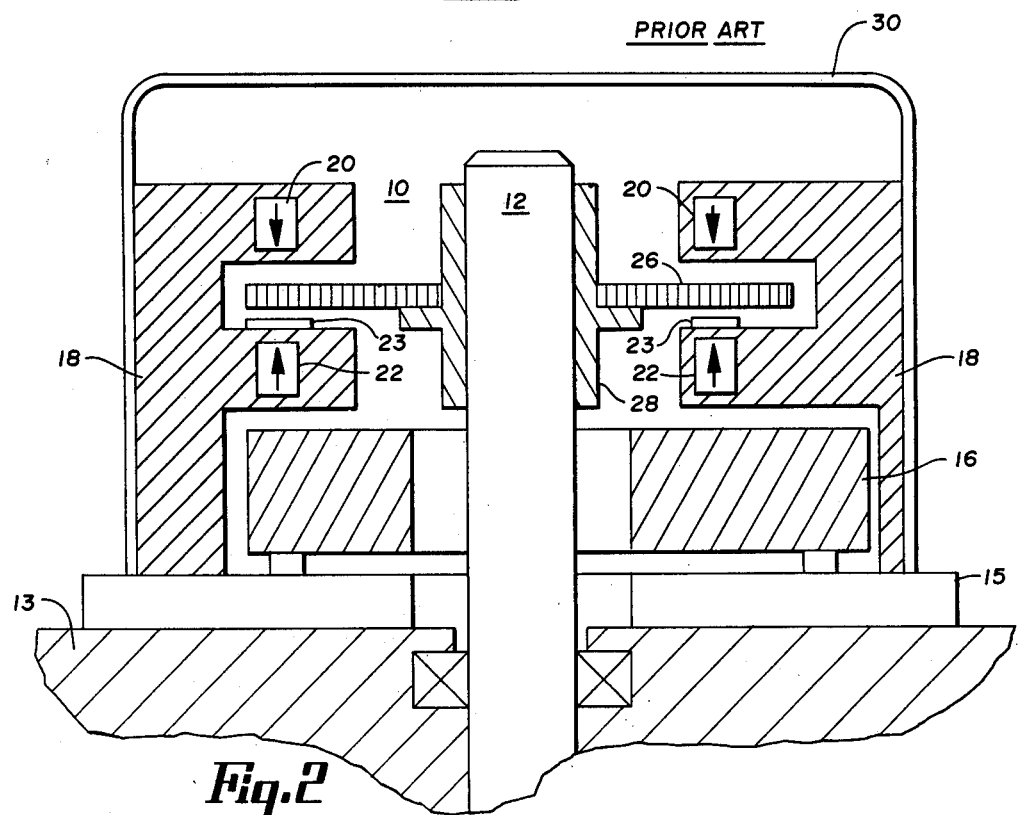
FIG. 1 is a cross-sectional view of a prior art kit encoder.

FIG. 1 shows a prior art modular encoder kit 10 mounted on a shaft 12 of a motor 13. The kit is comprised of a base plate 15 which is bolted to the motor 13. Mounted on the base plate are the encoder electronics 16 and a pair of plastic read heads 18, each of which includes a lamp 20 and a sensor 22. A stator 23 or mask is positioned above the sensor on the read head. The mask is inscribed with alternatively opaque and transparent areas to shutter the light pattern transmitted through the transparent areas of rotor disc 26 which is mounted on shaft 12 using hub 28. Disc 26 is mounted on hub 28 at the time of manufacture of the kit and the disc is positioned about the center line of the hub so that when the hub is mounted on shaft 12 and the shaft is rotated, the disc will be rotated about its geometrical center.

In typical prior art encoder kits such as the one shown schematically in FIG. 1, individual lamp and sensor pairs 20, 22 are utilized to generate each of the signals produced by the encoder. The long-term accuracy and stability of the prior art circuit is, therefore, heavily dependent upon the differential aging characteristics of the individual lamp and sensor combinations since uneven aging leads to an effective change in the electrical phase angle between the two alternating current waveforms generated by the encoder. Because the cover 30, the read heads 18, and the base plate 15 of the encoder kit are not formed from a single piece of material, vibration of the kit, which is encountered during normal operation of the motor, results in undesirable jitter or phase shift of the encoder output signals relative to each other. This jitter is caused by physical displacement of one lamp sensor combination 20,22 relative to the other and may also be induced on a long-term basis by differential thermal expansion of parts relative to each other or even thermal creep of the materials involved. The use of plastics for mounting read head elements in the prior art encoder kits also causes those units to be susceptible to a long-term phase angle shift due to an actual displacement of the sensor pairs relative to each other due to movement of the plastic parts relative to each other.

The user of the prior art encoders is required to orient encoder 10 relative to shaft 12 by aligning three or more mounting holes in base plate 15 with motor 13. In practice, in the prior art units, the mounting holes are all provided with a certain amount of "slop" so that the unit can be moved in two axes to permit alignment with shaft 12. In order to achieve proper alignment, it may also be necessary in the prior art units to provide for adjustment of the sensor heads 18 relative to base 15 and to adjust the position and orientation of stator of mask 23 relative to sensors 22. To perform these adjustment operations, a user is required to possess a high degree of skill and perform extremely tedious calibration operations requiring a substantial amount of time and patient effort.

Figure 2:
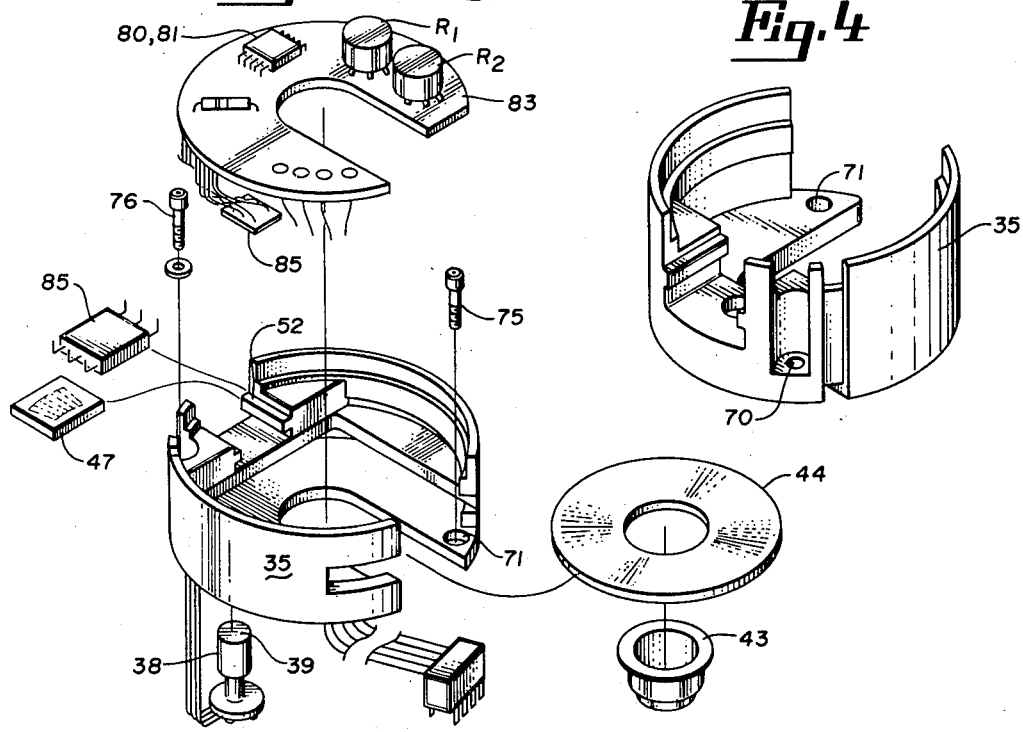
FIG. 2 is an exploded view of our novel encoder kit.
Figure 4:
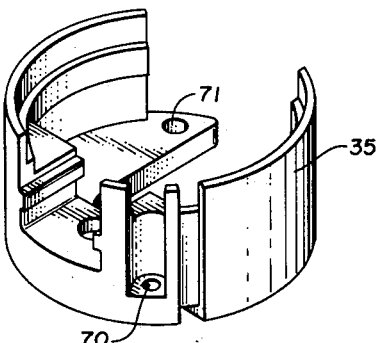
FIG. 4 is a perspective view of the encoder kit housing.

In order to overcome the disadvantages of the prior art encoder kit as shown in FIG. 1, the unique encoder shown in FIG. 2, in exploded form, was developed. The kit utilizes a one-piece unitary metal housing 35, which incorporates the functions of the individual read heads 18, base plate 15, and a portion of cover 30 shown in the prior art unit of FIG. 1. Housing 35, shown in further detail in perspective form in FIG. 4, can be either cast or machined depending upon the preference of the user. Rather than utilize the plastic materials prevalent in the prior art units, housing 35 is cast or machined from such an appropriate material as aluminum or an aluminum alloy to eliminate the geometrical distortion and instability problems inherent in prior art devices utilizing multiple pieces and plastic materials.

The preferred embodiment of the invention utilizes a single light source 38 to illuminate the sensors. A light source which has been found to be particularly suitable for this application is a light emitting diode which can be described as a type TIL 31 P-N gallium arsenide light source manufactured by Texas Instruments, Incorporated, and which includes an integral lens 39 to collimate the radiant energy which it generates. The characteristics of the radiation produced by source 38 are such that the energy produced is concentrated at the near infrared portion of the spectrum. Light source 38 is installed in a fixed position in housing 35 at the time of manufacture of the kit and is not adjustable by the user at the time of installation of the kit.

Figure 3:
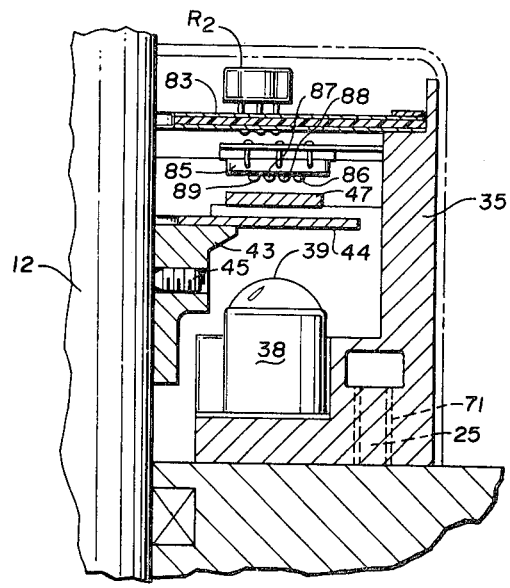
FIG. 3 is a cross section of the encoder kit showing the spacing and alignment of the light source stator and sensor assembly.

FIG. 3 is a cross section of an assembled encoder kit constructed according to our preferred embodiment. Radiation from light source 38 passes through code disc 44 which is mounted using hub 43 on shaft 12. The hub is secured to the shaft using a set screw 45.

Code disc 44 is a glass disc which, in the preferred embodiment shown, has been milled to a thickness of approximately 0.020 inches to minimize its inertia load. The alternate opaque and transparent sectors are placed on the glass by photo reduction from an enlarged master to a glass blank coated with a high resolution photographic emulsion manufactured by Kodak Corporation. Code disc 44 is mounted on hub 43, and particular care is taken during manufacture of the kit to assure that the axis of hub 43 is concentric to the pattern on disc 41 in a tight tolerance range so that the user will be required only to mount hub 43 on shaft 12 and fix it in place with a set screw 45 without having to realign disc 26 with the center line of shaft 12.

Figure 6:
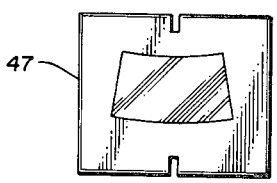
FIG. 6 is an elevation view of the stator.
Figure 7:
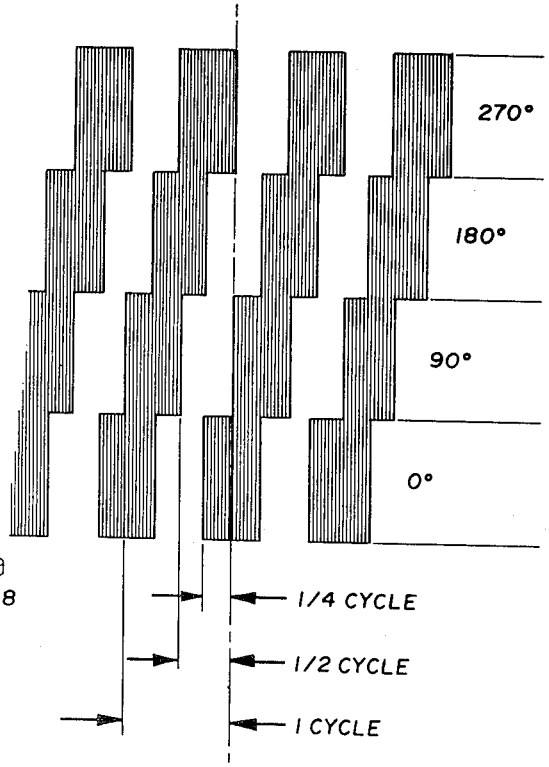
FIG. 7 is a detailed view of the stator.
Figure 8:
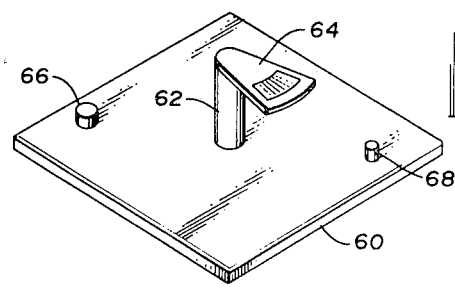
FIG. 8 is a perspective view of an alignment fixture for pre-aligning the stator relative to the housing.

Stator 47, shown in FIGS. 6 and 7, is positioned on a milled shoulder 52 of housing 35, which may be seen in FIG. 2. Stator 47 is formed from a glass blank having alternating opaque and transparent sectors laid out in a radial pattern having a center line coincident with the center line of shaft 12, hub 43, and code disc 41. Stator 47 has its opaque and transparent portions laid out for approximately a 15° segment on each side of a center line. FIG. 6 is a view of the entire stator, while FIG. 7 is a detail of a portion of the stator shown in 6, illustrating four alternating patterns of opaque and transparent sectors utilized to generate output signals.

Because the preferred embodiment of the invention, shown in FIGS. 2-10, is intended to have extremely high resolution in the range of 1,000 pulses per revolution, a great deal of care must be taken in aligning stator 47 with housing 35 at the time the encoder is manufactured. This can be done most effectively by using the alignment fixture shown in FIG. 8. The alignment fixture shown is comprised of a base plate 60, a post 62 which simulates the shaft 12 of a motor, and a segment 64 of a code disc which is positioned on shaft 62. The optical pattern of the disc segment 64 is carefully aligned with the center line of shaft 62 so that the code pattern has the same center line as the center line of the shaft. The calibration fixture also includes two vertical pins 66 and 68 which are oriented relative to shaft 62 to interface with mounting holes 70 and 71 of housing 35 and position segment 64 over the milled shoulder 52 of housing 35. The pins are sized to interface with mounting holes 70 and 71 without any "slop" so that housing 35 is held in a fixed position relative to shaft 62 which is precisely aligned with its center line coincident with the center line of housing 35. Shaft 62 has a height from the surface of plate 60 selected to make the vertical separation between segment 64 and stator 47 approximate the separation expected to be encountered after installation of the kit on a motor by a user.

Fixture 60 can be used to rapidly align stator 47 with housing 35 by positioning housing 35 on pins 66 and 68 of fixture 60 and aligning stator 47 with housing 35 while viewing the optical path through stator 47 and segment 64 of the coding disc. When stator 47 is properly aligned, the area of juxtaposition between stator 47 and code disc segment 64 will produce either a completely transparent or a completely opaque pattern when the center line of stator 47 is properly aligned with the lines on segment 64 and hence with the center line of fixture 60. After alignment, stator 47 is cemented permanently into place and need not again be adjusted by the user at the time the kit is installed.

Housing 35 is particularly adaptable to orientation with motor 13 upon which the kit or modular encoder is to be mounted. The mounting of prior art kit encoders, such as shown in FIG. 13, necessitates alignment of the entire encoder 10 with motor shaft 12 prior to tightening the three mounting screws. Conventional kit encoders 10 utilize a generally sloppy fit for all three mounting holes to permit alignment of the encoder with shaft 12.

Figure 5:
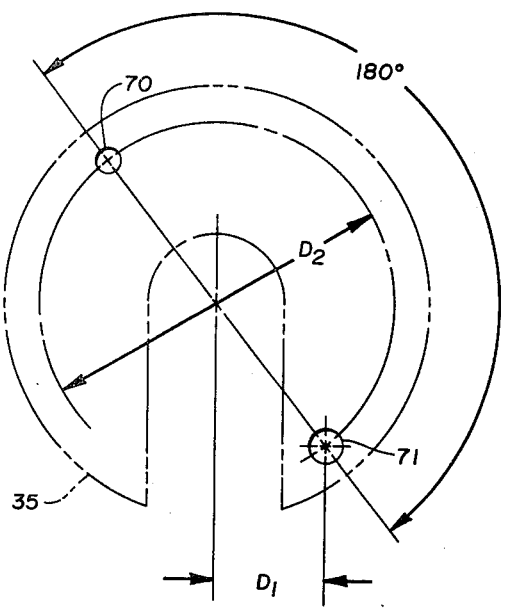
FIG. 5 is illustrative of the mounting hole spacing.

In the preferred embodiment of the present invention, the hole pattern of housing 35 is as shown in FIG. 5 and includes a small hole 70 and a larger hole 71. In the preferred embodiment, the holes 70 and 71 are located on a line which passes through the center line of housing 35 and on a circle having a diameter $D_2$ of 1.280 inches. Hole 70 has a diameter between 0.091 and 0.095 inches, while hole 71 has a diameter between 0.105 and 0.113 inches. The mounting screws 75 and 76 have a diameter of approximately 0.090 inches. The displacement $D_1$ of hole 71 from the center line of the cutaway portion in housing 35 is 0.412 inches.

Figure 9:
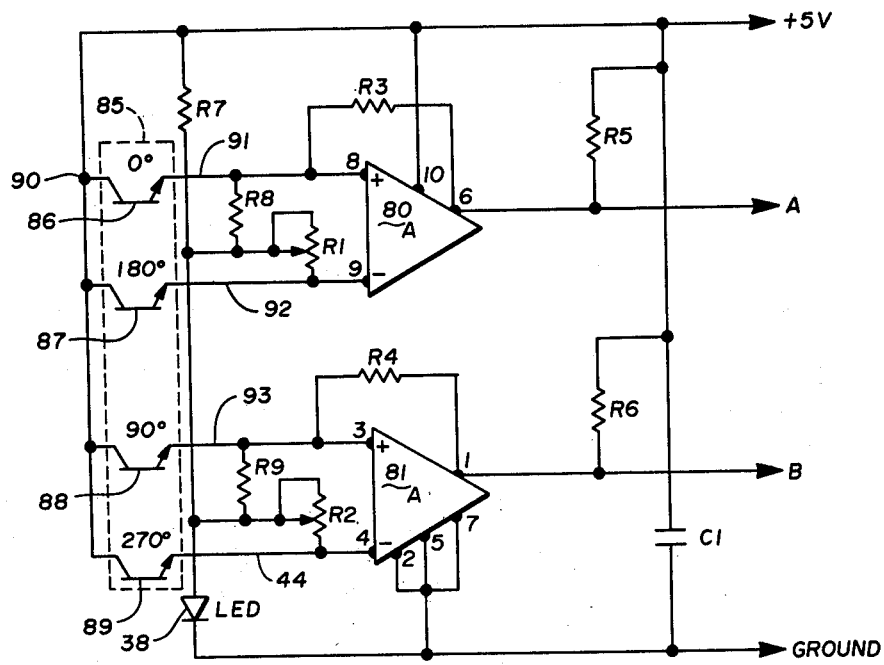
FIG. 9 is a schematic of the electronic circuit used for generating the encoder output signals.
Figure 10:
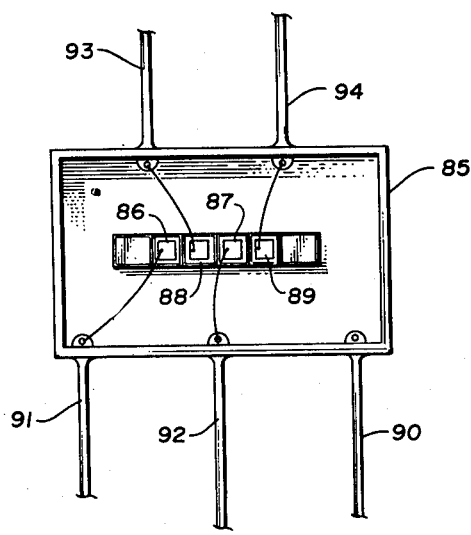
FIG. 10 is a plan view of the phototransistor array utilized in the modular encoder.

The housing 35 is aligned with the motor 13 by mounting hub 43 and disc 41 on shaft 12 and sliding housing 35 into position such that center line of shaft 12 is aligned with the center line housing 35. The screw 76 is passed through smaller hole 70 of housing 35 and tightened. The pre-alignment of stator 47 with housing 35 at the time of manufacture of the kit and the pre-alignment of code disc 41 with hub 43 sufficiently pre-align the entire assembly such that the only adjustment necessary at the time of installation of the kit to the motor is a slight rotation of housing 35 about the center line of hole 70, while the output waveforms A and B from the encoder electronics shown in FIG. 9 are viewed on an oscilloscope. Adjustment is continued until the two signals are exactly in quadrature with each other, i.e. shifted 90° from each other, and then screws 75 and 76, respectively, are tightened to lock housing 35 into a fixed relationship with motor 13 and shaft 12.

The circuitry for generating the two electrical output signals from the preferred embodiment of the encoder is shown in the schematic of FIG. 9. The two comparators 80 and 81 are part of an LM119 high-speed dual comparator manufactured by National Semiconductor Corporation. The pin number designations for the two comparators 80 and 81 on FIG. 9 correspond to those designated by the manufacturer for the flat package configuration of the voltage comparators. The circuitry includes adjustable resistors R1 and R2 and further resistors R3 through R9 which are all mounted on printed circuit board 83 shown in FIG. 2. The phototransistor sensors are located in a sensor package 85 shown in enlarged form in FIG. 10 and in schematic form in FIG. 9.

The phototransistor package is mounted on the bottom of printed circuit board 83 in a fixed position. The phototransistor array 85 is comprised of individual phototransistors 86, 87, 88, and 89 which are in a straight line and which have their common collectors connected to the case 85 of the package and a lead 90 which is connected to a DC power supply. The array 85 is aligned such that the line of phototransistors 86–89 are aligned with a radical line passing through the center line housing 35. The individual emitters of transistors 86, 87, 88, and 89 are connected to the positive and negative input terminals of comparators 80 and 81, as shown in FIG. 9. The individual phototransistors are aligned with the optical path from LED 38 code disc 41 in stator 47 so that the base emitter junction of each phototransistor is illuminated by the light pattern passing through one of the four patterns, as shown in FIG. 7. Thus phototransistor 86 receives the "0°" phase pattern, while phototransistor 87 receives the 180° shifted phase pattern. Similarly, phototransistors 88 and 89 receive the 90° and 270° phase patterns. Thus, as motor shaft 12 rotates and drives the code disc past the stator, either phototransistor 86 or 87 is illuminated and turned on at all times. Similarly, one of the pair of phototransistors 88 and 89 is always illuminated and turned on. The output signals at A and B are thus square waves which have their zero crossing coincident with the switching of the input phototransistors of its respective comparator 80 or 81.

What is claimed is:
1. A fixture for pre-aligning an optical encoder stator with a housing in which a sensor and light source are installed to permit said housing to be installed comprising:
   a base plate;
   a shaft segment mounted on said base plate;
   means for attaching said housing to said base plate with an axis of said housing aligned with the center line of said shaft segment;
   an encoder disc segment mounted with its center line aligned with said axis of said shaft segment at a height above said base plate corresponding to the separation between said encoder disc and said base plate, said encoder disc segment positioned in the path between said light source and said sensor mounted on said housing to permit optical alignment of said stator with said housing prior to actual installation of said encoder on said base plate.

2. A method for pre-aligning an optical encoder stator with the unitary housing sensor and light source comprising the steps of:
   mounting said housing on a test fixture;
   positioning a portion of an encoder disc at the normal position between said sensor and said light source;
   optically aligning said stator with said encoder disc segment; and
   permanently mounting said stator in its aligned position.

* * * * *